(12) United States Patent
Nothhelfer et al.

(10) Patent No.: US 12,389,804 B2
(45) Date of Patent: Aug. 12, 2025

(54) METHOD AND DEVICE FOR PROVIDING ANYONS, USE OF THE DEVICE

(71) Applicant: Johannes Gutenberg-Universität Mainz, Mainz (DE)

(72) Inventors: Jonas Nothhelfer, Dexheim (DE); Kjetil Magne Dørheim Hals, Grimstad (NO); Karin Everschor-Sitte, Mainz (DE); Matteo Rizzi, Mainz (DE)

(73) Assignee: JOHANNES GUTENBERG-UNIVERSITÄT MAINZ, Mainz (DE)

( * ) Notice: Subject to any disclaimer, the term of this patent is extended or adjusted under 35 U.S.C. 154(b) by 908 days.

(21) Appl. No.: 17/596,478

(22) PCT Filed: Jun. 10, 2020

(86) PCT No.: PCT/EP2020/066120
§ 371 (c)(1),
(2) Date: Dec. 10, 2021

(87) PCT Pub. No.: WO2020/249630
PCT Pub. Date: Dec. 17, 2020

(65) Prior Publication Data
US 2022/0261678 A1    Aug. 18, 2022

(30) Foreign Application Priority Data
Jun. 13, 2019  (EP) .................................. 19179910

(51) Int. Cl.
*H10N 50/10*    (2023.01)
*G06N 10/20*   (2022.01)
(Continued)

(52) U.S. Cl.
CPC ............. *H10N 50/10* (2023.02); *G06N 10/20* (2022.01); *G06N 10/40* (2022.01); *H10N 50/85* (2023.02); *H10N 60/83* (2023.02); *H10N 60/85* (2023.02)

(58) Field of Classification Search
CPC ........ H10N 50/10; H10N 50/85; H10N 60/83; H10N 60/85; G06N 10/20; G06N 10/40
See application file for complete search history.

(56) References Cited

U.S. PATENT DOCUMENTS 10,297,739 B1 *   5/2019   Gooth .................. H03K 19/195
10,490,600 B2 *  11/2019   Freedman ............ H10N 60/128
(Continued)

FOREIGN PATENT DOCUMENTS

JP   2013247267 A   12/2013
WO  2019001753 A1    1/2019

OTHER PUBLICATIONS

"Composite topological excitations in ferromagnet-superconductor heterostructures", Kjetil M. D. Hals, Michael Schecter, and Mark S. Rudner, arXiv: 1603.07550v2 Jul. 9, 2016.*
(Continued)

*Primary Examiner* — Nha T Nguyen
(74) *Attorney, Agent, or Firm* — Brake Hughes Bellermann LLP

(57) ABSTRACT

The present description relates to a method and a device for providing anyons that may be used for topological quantum computation. The method comprises the steps of providing a magnetic material containing at least one magnetic texture providing a superconductor containing at least one vortex; creating at least one magnetic texture-vortex pair by coupling the magnetic material to the superconductor, wherein each magnetic texture-vortex pair binds an anyon being
(Continued)

localized at the vortex of the respective magnetic texture-vortex pair in the superconductor.

20 Claims, 7 Drawing Sheets

(51) Int. Cl.
*G06N 10/40* (2022.01)
*H10N 50/85* (2023.01)
*H10N 60/83* (2023.01)
*H10N 60/85* (2023.01)

(56) References Cited

U.S. PATENT DOCUMENTS

| | | | | |
|---|---|---|---|---|
| 11,010,684 | B2* | 5/2021 | Pikulin | G06N 10/40 |
| 2014/0221059 | A1* | 8/2014 | Freedman | B82Y 10/00 |
| | | | | 455/899 |
| 2014/0279822 | A1* | 9/2014 | Bonderson | B82Y 10/00 |
| | | | | 706/62 |
| 2014/0354326 | A1* | 12/2014 | Bonderson | G06N 10/40 |
| | | | | 505/170 |
| 2017/0091649 | A1 | 3/2017 | Clarke et al. | |
| 2017/0141287 | A1* | 5/2017 | Barkeshli | H10N 60/805 |
| 2017/0178747 | A1* | 6/2017 | Tokunaga | H01L 29/82 |
| 2017/0179375 | A1* | 6/2017 | Nagaosa | H10N 52/00 |
| 2017/0256351 | A1* | 9/2017 | Cros | H10N 50/80 |
| 2018/0052806 | A1 | 2/2018 | Hastings et al. | |
| 2018/0053809 | A1* | 2/2018 | Freedman | H10N 69/00 |
| 2020/0044137 | A1* | 2/2020 | Schueffelgen | B82Y 10/00 |
| 2024/0403680 | A1* | 12/2024 | Pikulin | G06N 10/20 |

OTHER PUBLICATIONS

International Search Report and Written Opinion from PCT/EP2020/066120, Sep. 4, 2020, 14 pages.

Everschor-Sitte, K., et al., "Perspective: Magnetic skyrmions—Overview of recent progress in an active research field", Journal of Applied Physics, vol. 124, No. 24, Dec. 26, 2018, 9 pages.

Güngördü, Utkan, et al., "Stabilization and control of Majorana bound states with elongated skyrmions", Phys. Rev. B 97 (https://arxiv.org/abs/1710.04159), Mar. 16, 2018, 4 pages.

Halls, Kjetil, et al., "Composite Topological Excitations in Ferromagnet-Superconductor Heterostructures", Physical Review Letters, vol. 117, No. 1, Jun. 1, 2016, 3 pages.

Menezes, Rai M., "Manipulation of Magnetic Skyrmions by Superconducting Vortices in Ferromagnet-Superconductor Heterostructures", Phys. Rev. B 100 (https://arxiv.org/abs/1904.04537), May 3, 2019, 7 pages.

Rex, Stefan, et al., "Majorana bound states in magnetic skyrmions imposed onto a superconductor", Phys. Rev. B 100 (https://arxiv.org/abs/1904.04177v1), Apr. 8, 2019, 7 pages.

Straver, E., et al., "Controlled Manipulation of Individual Vortices in a Superconductor", Appl. Phys. Lett. 93 (https://arxiv.org/abs/0810.0790), Oct. 4, 2008, 3 pages.

* cited by examiner

METHOD AND DEVICE FOR PROVIDING ANYONS, USE OF THE DEVICE

CROSS REFERENCE TO RELATED APPLICATION

This application is a 35 U.S.C. § 371 National Phase Entry application from PCT/EP2020/066120 filed Jun. 10, 2020, designating the U.S., and claims the benefit of European Application No. 19179910.5, filed Jun. 13, 2019, the disclosures of which are incorporated herein by reference in their entireties.

The present invention relates to a method and a device for providing anyons that may be used for topological quantum computation. Moreover, the invention relates to the use of the device.

One of the major challenges of the next generations is to realise quantum technologies and bring them to commercial application. For example, the EU has launched the European Flagship program as a large-scale, long-term research initiative with an expected budget of EUR 1 billion focusses in four application areas: Quantum communication, quantum simulation, quantum computing and quantum metrology and sensing. Storing and processing information on the basis of so-called qubits, instead of classical binary logic units (bits), allows to tackle computational problems which are practically infeasible on classical computers. Although quantum computation is currently a research field in its infancy, the economic interest in realising quantum computers is huge and therefore any invention bringing this area a step forward can be considered as a major accomplishment. For example, a highly competitive race is currently going on between academic and industrial research centers, working on several different physical platforms as superconducting qubits, ion traps, nitrogen vacancy centers, and quantum dots, just to name a few.

A very promising field within the area of quantum computation is the one of topological quantum computation, which circumvents instabilities exploiting topological properties. Here the logical subspace is built by topological excitations of the underlying material (dubbed as anyons) and the computational gates are performed by their controlled exchange, i.e., braiding.

A topological quantum computer is a quantum computer that employs two-dimensional quasiparticles called anyons, whose world lines pass around one another to form braids in a three-dimensional spacetime (i.e., one temporal plus two spatial dimensions). These braids form the logic gates that make up the computer. The advantage of a quantum computer based on quantum braids over using trapped quantum particles is that the former is much more stable. Small, cumulative perturbations can cause quantum states to decohere and introduce errors in the computation, but such small perturbations do not change the braids' topological properties. Anyons are quasiparticles in a two-dimensional space. Anyons are neither fermions nor bosons, but like fermions, they cannot occupy the same state. Thus, the world lines of two anyons cannot intersect or merge, which allows their paths to form stable braids in space-time. When anyons are braided, the transformation of the quantum state of the system depends only on the topological class of the anyons' trajectories (which are classified according to the braid group). Therefore, small errors in the trajectories do not destroy the quantum information which is stored in the state of the system.

A major challenge in today's topological quantum computation is to develop robust, stable and efficient techniques for performing the braiding of the anyons. Several different techniques have been proposed, but none of them have yet been realized. Also, the previously proposed techniques have practical drawbacks. The most known suggestions are approaches of T-junctions, where a T-shaped semiconducting wire is placed on a superconductor and the braiding is done by exchanging the states at the edges, as described in J. Alicea et al: "Non-Abelian statistics and topological quantum information processing in 1D wire networks", Nat. Phys., vol. 7, pp. 412-417, May 2011, D. Aasen et al: "Milestones toward Majorana-based quantum computing", Phys. Rev. X, vol. 6, p. 031016, August 2016, and B. Bauer et al: "Dynamics of Majorana-based qubits operated with an array of tunable gates", SciPost Phys., vol. 5, p. 004, July 2018. The problem of this technique is that it requires a time dependent tuning of the local chemical potential, which can be performed using gate voltages but is hard to do experimentally. Additionally, it is a one-dimensional system. It would be preferable, however, to do the braiding in two-dimensions, because the anyons are a concept of two-dimensional systems.

Topological quantum computations have also been studied theoretically in systems of atomic lattices, as described, e.g., in A. Bühler et al: "Majorana modes and p-wave superfluids for fermionic atoms in optical lattices", Nature Communications, vol. 5, p. 4504, December 2014, and B. Paredes et al: "1/2-Anyons in Small Atomic Bose-Einstein Condensates", Phys. Rev. Lett., vol. 87, p. 010402, June 2001. In such systems, the braiding of the anyons is proposed to be done using lasers. While being truly two-dimensional, a robust toolbox for performing the computation is still lacking.

Further, until now there is a big uncertainty if the zero-energy modes that where found experimentally in several condensed matter systems are real anyons. The only way to be sure if the modes that were found are anyons is to braid them.

Thus, it is a problem of the present invention to overcome the above mentioned drawbacks. In particular, it is a problem of the present invention to provide a platform where such modes can be created in order to unambiguously identify them as anyons and use them for topological quantum computation and quantum memories. Moreover, it is a problem of the present invention to provide a method and a device, which enable the braiding of anyonic quasiparticles with the help of presently available technology, thus providing a central building block for the realization of a topological quantum computer. These problems are solved by the features defined in the independent claims. Preferred embodiments are defined in the dependent claims.

According to one aspect of the present invention, a method for providing, and particularly manipulating and/or braiding, at least one anyon being usable for topological quantum computation is provided. The method comprises the steps of:
  providing a magnetic material containing at least one magnetic texture;
  providing a superconductor containing at least one vortex; and
  creating at least one magnetic texture-vortex pair by coupling the magnetic material to the superconductor, wherein each magnetic texture-vortex pair binds an anyon being localized at the vortex of the respective magnetic texture-vortex pair in the superconductor.

Preferably, more than one anyon, particularly at least two anyons, are provided by the method. Accordingly, the magnetic material contains at least two magnetic textures, the superconductor contains at least two vortices, and at least two magnetic texture-vortex pairs are created by coupling the magnetic material to the superconductor.

The magnetic material may be provided as a thin magnetic layer. It may comprise or be, e.g., a ferromagnetic, antiferromagnetic or ferrimagnetic material. Possible magnetic materials include any materials in which magnetic textures, and particularly skyrmions, can be created, such as MnSi, FeCoSi. In particular, layered systems being tailored to break inversion symmetry to allow for magnetic textures or skyrmions, such as CoFeB, FeGe or Fe/Ir, may be used as the magnetic material.

Depending on the interface interactions, also Co or Permalloy might be used. The size of the magnetic material is chosen such that it allows to include at least one skyrmion. The size of a skyrmion is on the order of the typical helical length scale which typically is in the range of 1 nm to 5 µm. A summary of materials that are known to host skyrmions is given, e.g., in table I of K. Everschor-Sitte et al: "Perspective: Magnetic skyrmions—Overview of recent progress in an active research field", Journal of Applied Physics 124, 240901 (2018 https://doi.org/10.1063/1.5048972, which is incorporated herein by reference in its entirety. The thickness of the magnetic layer may be on the order of 1 nm to 100 nm.

The superconductor, particularly a type II superconductor, may be provided as a superconducting layer. For example, Nb, Cuprate based type II superconductors such as YBCO, $NbSe_2$, Covalent superconductors such as boron-doped diamond or silicon carbide or carbon based compounds such as $C_{60}Cs_2Rb$ or $C_{60}Rb_x$ may be used as superconductor. The dimensions of the superconductor may be such that it can accommodate at least one vortex. In particular, the dimensions of the superconductor may be larger or in the order of the dimensions of the magnetic material.

A magnetic texture may generally comprise any magnetic structure or spin structure. Preferably, the magnetic texture is a magnetic localized structure, particularly a localized spin structure or spin texture. Preferably, the magnetic texture is a topological magnetic texture and particularly a topological magnetic localized structure. It is noted in this respect that topology, which is a well-known mathematical concept, indicates a system for which two structures are equivalent as a continuous mapping from one to the other structure exists. In physics, this concept translates to a finite energy barrier separating the two topologically distinct configurations.

A magnetic texture may be a skyrmion, an antiskyrmion, a skyrmionium, a biskyrmion and/or any other spin texture that is suitable to be bound on a superconducting vortex. An overview of the zoo of (topological) magnetic textures, including information of how to create, annihilate and move such magnetic textures in a magnetic material is given in K. Everschor-Sitte et al: "Perspective: Magnetic skyrmions-Overview of recent progress in an active research field", J. Appl. Phys. 124, 240901 (2018), https://doi.org/10.1063/1.5048972 (particularly see FIG. 1 and section IV therein), which is incorporated herein by reference in its entirety. In particular, as described in this paper (particularly section IV.A therein), skyrmions may be generated by magnetic fields, thermal excitations, spin torques, and/or electric fields. Accordingly, in a preferred embodiment, the step of providing a magnetic material containing magnetic textures comprises generating the magnetic textures in the magnetic material by means of magnetic fields, electric fields, electromagnetic fields, thermal excitations and/or spin torques. Additionally, a recent paper about the creation of ferrimagnetic Skyrmions is Woo et al: "Deterministic creation and deletion of a single magnetic skyrmion observed by direct time-resolved X-ray microscopy", Nature Electronics, vol. 1, pages 288-296, May 2018, https://www.nature.com/articles/s41928-018-0070-8. Since it is already well-known how magnetic textures can generally be created in magnetic materials, this is not described herein in more details.

Providing a magnetic material containing or hosting magnetic textures particularly means that the magnetic material is prepared and operated such that magnetic textures are present in the magnetic material. Correspondingly, providing a superconductor containing or hosting vortices particularly means that the superconductor is prepared and operated such that superconducting vortices or fluxons such as Abrikosov vortices are present in the superconductor.

By coupling the magnetic material to the superconductor, at least a magnetic texture-vortex pair, i.e. a pair consisting of a magnetic texture comprised in the magnetic material and a vortex comprised in the superconductor, is created or formed. In other words, in a magnetic texture-vortex pair, a magnetic texture of the magnetic material is coupled or bound to a vortex of the superconductor. The magnetic texture-vortex pair, which is also referred to as spin texture-vortex pair, can be considered as a quasiparticle.

In the sense of the present description, the term "coupling" particularly means that the magnetic material and the superconductor are arranged and/or approximated to each other such that the so called "proximity effect" occurs. As a result of the proximity effect, properties of the magnetic material are induced into the superconductor and vice versa. In other words, the magnetic texture-vortex pairs are created as a result of an attractive interaction between the magnetic texture of the magnetic material and the vortex of the superconductor. For further general information about proximity effects in superconductor-ferromagnet heterostructures, reference is made to A. I. Buzdin: "Proximity effects in superconductor-ferromagnet heterostructures", Rev. Mod. Phys., vol. 77, issue 3, pages 935-976, September 2005, American Physical Society, DOI: 10.1103/RevModPhys.77.935, https://link.aps.org/doi/10.1103/RevModPhys.77.935, which is incorporated herein by reference in its entirety.

In G. Yang et al: "Majorana bound states in magnetic skyrmions", Phys. Rev. B, vol. 93, no. 22, pp. 1-8, 2016, K. Pöyhönen et al: "Skyrmion-induced bound states in a p-wave superconductor", Phys. Rev. B, vol. 94, no. 21, pp. 1-9, 2016, and U. Güngördü et al: "Stabilization and control of Majorana bound states with elongated skyrmions", Phys. Rev. B, vol. 97, p. 115136, March 2018, it has been suggested that Majorana modes emerge at the coupling of a magnetic (higher order) skyrmion with a superconductor without coupling them to vortices. However, it has been found within the present invention that these Majorana modes have major disadvantages regarding their usability for quantum computation. First of all, it has been found within the present invention that in such systems the Majorana modes are only weakly bound to the skyrmion by the exchange field. Furthermore, it has been found within the present invention that an additional Majorana mode appears at the boundary of the skyrmion which hinders a controlled braiding of Majorana modes.

According to the present invention, an anyon is bound to a magnetic texture-vortex pair and localized at the vortex of the magnetic texture-vortex pair. That is, the anyon is localized completely in the superconductor. In particular, it has been found within the present invention that in a device or system according to the present invention, when at least two magnetic texture-vortex pairs are present, the anyons that are bound to the magnetic texture-vortex pairs are all localized within a respective magnetic texture-vortex pair. In particular, each magnetic texture-vortex pair binds exactly one (i.e. only one) anyon. Thus, according to the present invention, a device or system is provided, where the anyons are only localized to the quasiparticles (i.e. the magnetic texture-vortex pairs). This advantageously allows to individually address the anyons.

The method and the corresponding device or system according to the present invention allow for the first time to braid anyons by means of known experimental techniques (which are herein referred to as "spintronic toolbox"). In particular, the magnetic texture-vortex pairs that are created according to the present invention are controllable by the constantly developing spintronic toolbox. This therefore decisively eases the manipulation of anyons and, ultimately, the access to topological quantum information processing. Further, the braiding can advantageously be performed in a real two-dimensional system and little to no error correction is necessary. Moreover, the suggested method and device according to the present invention allow for scalability, which solves another big challenge in current tentatives towards quantum computation setups.

In a preferred embodiment, a magnetic texture comprises or is a skyrmion. Additionally or alternatively, a magnetic texture-vortex pair comprises or is a skyrmion-vortex pair. Additionally or alternatively, an anyon comprises or is a Majorana zero mode. A skyrmion is a whirl-like magnetic texture with a unique topology. In particular, a skyrmion is any spin structure in which the center magnetization is in the opposite direction to its boundary and which can be mapped once to the sphere. In this sense, a radially symmetric skyrmion may be characterized by two quantities, its radial profile and the twisting angle.

In a further preferred embodiment, the superconductor is a type II superconductor and operated to be in the Shubnikov phase. This can be achieved by applying a magnetic field between the two critical magnetic fields BC1 and BC2 of the superconductor at temperatures below the Curie-temperature. In particular, an Abrikosov vortex lattice may be formed in the superconductor.

In a further preferred embodiment, coupling the magnetic material to the superconductor comprises arranging the magnetic material and the superconductor such that a heterostructure based on the magnetic material and the superconductor is formed. In particular, the magnetic material may be arranged directly onto the superconductor. In particular, by arranging the magnetic material onto the superconductor, an attractive interaction between the magnetic textures (e.g. skyrmions) in the magnetic layer and the vortices in the superconductor occurs. Due to this attractive interaction, the magnetic texture-vortex pairs are created. Alternatively, in case that the magnetic textures are moved by means of electric current (see below), the magnetic material and the superconductor may be separated by a thin insulating layer. The thickness d of the insulating layer is chosen such that the attractive interaction between the magnetic textures in the magnetic layer and the vortices in the superconductor is still present and sufficient to create the magnetic texture-vortex pairs. In other words, the thickness d of the insulating layer is chosen such that the current flow in the superconductor is negligible while the heterostructure still experiences a significant exchange field coupling magnetic textures and vortices. This is possible because the exchange field and the current scale differently as function of layer thickness d. While the exchange field is proportional to $d^2$, the current is proportional to $d^4$. For example, the thickness d of the insulating layer may be in the range of a few Angstrom (e.g. 0.2 nm to 5 nm).

In a further preferred embodiment, the method further comprises the step of moving at least two magnetic texture-vortex pairs by means of spintronic techniques such that the anyons that are bound to (and localized at) the moved magnetic texture-vortex pairs are braided. By braiding two magnetic texture-vortex pairs, the computational gate, i.e., a qubit can be provided. Preferably, two adjacent magnetic texture-vortex-pairs are moved. In particular, exactly two magnetic texture-vortex pairs are moved. The spintronic techniques particularly comprise applying magnetic field gradients to the magnetic material, applying electric fields to the magnetic material, inducing spin torques in the magnetic material, inducing magnons in the magnetic material, generating temperature gradients within the magnetic material and/or generating thermal fluctuations within the magnetic material. By using such well-established "spintronic techniques", the anyons (particularly the Majorana zero modes) can be manipulated in two-dimensional superconductors. The so-called spintronic toolbox is well known and processed every day in labs all over the world. Regarding the "spintronic toolbox" reference is made to K. Everschor-Sitte et al: "Perspective: Magnetic skyrmions—Overview of recent progress in an active research field", Journal of Applied Physics, vol. 124, 240901 (2018), https://doi.org/10.1063/1.5048972, particularly section IV therein, which has already been cited above and which is incorporated herein by reference in its entirety. For example, spin torques are current induced torques to manipulate magnetic textures. Prominent examples are STT (spin transfer torque) and SOT (spin-orbit torque), experimentally performed in several groups world-wide. Moving a magnetic texture-vortex pair by electrical fields can for example be performed by means of a scanning tunnelling microscope (STM) tip. One particular approach to displace spin textures that involves magnons is the use of temperature gradients. Here, thermal spin currents can transfer angular momentum and additionally entropic effects can also lead to a motion of spin structures as well. Moreover, even without any external drives, magnetic textures or skyrmions can change their positions randomly due to thermal fluctuations in very weakly pinned samples at higher temperatures.

In a further preferred embodiment, two magnetic texture-vortex pairs are braided by moving the two magnetic texture-vortex pairs by means of at least one scanning-tunnelling microscope (STM) tip and/or by applying currents (including current pulses) in the magnetic material. Due to their topology, skyrmions experience a Magnus force, which is similar to the rotation of a ball during a curved shot, and therefore move along the applied current.

In a further preferred embodiment, the method comprises the step of reading out information by fusing two anyons. In particular, the information that is read out is a logical information in form of a qubit. Two anyons, i.e. an anyon pair (e.g. two Majorans), form a fermionic state, which is either occupied by an electron or unoccupied. By moving the two anyons with respect to each other and then fusing the anyons, an electron is created or not. Accordingly, the read-out step preferably comprises a detection of electrons and/or a current measurement.

In a further preferred embodiment, providing a magnetic material comprises structuring the magnetic material to form a grid of magnetic material. The grid may be structured or formed by using standard fabrication techniques such as optical and/or electron-beam lithography. Thus, the provided magnetic material is formed as a grid. The grid of magnetic material preferably comprises a plurality of electrodes. A voltage can be applied to the electrodes and thus, a current can be induced into the magnetic material or the grid thereof. The electrodes serve to move the magnetic texture-vortex pairs by means of electric currents. The electrodes may be fabricated by using standard fabrication techniques such as optical and/or electron-beam lithography and vacuum deposition. In particular, the geometry of the grid is configured such that the magnetic texture-vortex pairs can be moved around each other within the grid, particularly within predefined paths of the grid. Preferably, the geometry of the grid is configured such that the magnetic texture-vortex pairs can be moved independently within the grid or along predefined paths of the grid. In other words, the grid preferably comprises or defines one or more (predefined) paths along which the at least one texture-vortex pair can be moved, e.g. by means of current. In particular, the grid comprises or defines a plurality of such paths. The number of paths may depend on the number of magnetic textures that are present in the magnetic material. The grid may comprise gaps having a rectangular or a triangular cross section. The number of gaps may depend on the number of magnetic textures present in the magnetic material and thus on the number of magnetic texture-vortex pairs. In particular, the more magnetic textures and/or magnetic texture vortex pairs are created, the more gaps have to be present in the grid. As a result of structuring or forming the magnetic material as a grid, a controlled manipulation and/or movement of the magnetic texture-vortex pairs, and thus a controlled braiding of the anyons, are possible.

In particular, the method comprises the step of moving two magnetic texture-vortex pairs, and thus two anyons, by applying voltages to at least some of the electrodes of the grid such that the two anyons move around each other, thereby braiding the anyons.

According to a further aspect of the present invention, a device for providing, and particularly manipulating and braiding, anyons is provided. The device comprises:
  a magnetic material which, in an operational mode of the device, contains at least one magnetic texture;
  a superconductor which, in the operational mode of the device, contains at least one vortex;
  wherein the magnetic material and the superconductor are arranged to be coupled to each other such that at least one magnetic texture-vortex pair is created in the operational mode of the device, wherein each magnetic texture-vortex pair binds an anyon being localized at the vortex of the respective magnetic texture-vortex pair in the superconductor.

In particular, more than one anyon, particularly at least two anyons, are provided by the device. Accordingly, the magnetic material contains at least two magnetic textures, the superconductor contains at least two vortices, and at least two magnetic texture-vortex pairs are created by coupling the magnetic material to the superconductor.

The operational mode is a mode in which the device is operated to provide the at least one anyon. In particular, operating the device in the operational mode means that any conditions such as temperature, magnetic field, electric field, etc., that are necessary to create at least one magnetic texture in the magnetic material and to create at least one vortex in the superconductor, are met. For example, in order to create at least one vortex in the superconductor, the superconductor may be operated in the Shubnikov phase, which is achieved by applying a magnetic field between the two critical magnetic fields BC1 and BC2 of the superconductor at temperatures below the Curie-temperature of the superconductor. Further, in order to create at least one magnetic texture in the magnetic material, any available techniques such as a generation of magnetic textures by magnetic and/or electric fields, the generation of magnetic textures by thermal excitations and/or by spin torques may be used, see above.

In a preferred embodiment, the magnetic material and the superconductor, which in particular is a type-II superconductor, are arranged to form a heterostructure.

In a further preferred embodiment, the device comprises an insulating layer which is arranged between the magnetic material and the superconductor.

In a further preferred embodiment, the magnetic material is structured to form a grid of magnetic material, wherein the grid has preferably a rectangular or a square geometry. Alternatively, the grid has a triangular geometry or shape, i.e. a geometry with a triangular structure or lattice. In particular, the grid has a plurality of gaps, wherein each of the gaps preferably has a rectangular cross section and/or a quadratic cross section or a triangular cross section. With these geometries, it is possible to perform arbitrary braids of anyons by moving them within the grid or along predefined paths of the grid. Thus, due to the grid, the magnetic textures and thus the magnetic texture-vortex pairs can be manipulated, moved and/or braided in a controlled manner.

In a further preferred embodiment, the grid of magnetic material comprises a plurality of electrodes to which a voltage is applicable. The electrodes serve to move the magnetic texture-vortex pairs by means of electric currents. The number of electrodes may scale with the number of anyons in the device or system.

In a further preferred embodiment, the grid of magnetic material forms a plurality of (predefined) paths in which the magnetic textures are movable. Due to their functionality, the paths or lanes may also be referred to as current paths. The magnetic textures (particularly skyrmions) can be moved along these paths by applying a current through the paths via the electrodes. Accordingly, in this embodiment, the movement of the magnetic textures is current driven. Preferably, each of the paths has two end portions. Further, each of the end portions preferably comprises an electrode. Thus, the number of (current) paths formed by the grid is half of the number of electrodes.

In a further preferred embodiment, the device comprises an operating unit which is configured to bring the magnetic material and/or the superconductor in the operational mode. In other words, the operating unit is configured to create the at least one magnetic texture in the magnetic material and/or to create the at least one vortex in the superconductor. Thus, the operating unit is configured to operate the device in the operating mode in which the at least one magnetic texture-vortex pair (and thus the anyion) is formed or generated. The operating unit may comprise any units that are necessary generate the at least one magnetic texture in the magnetic material and the at least one vortex in the superconductor. More specifically, the operating unit may comprise a magnetic texture generation unit and/or a vortex generation unit. The magnetic texture generation unit is configured to generate the at least one magnetic texture in the magnetic material, and the vortex generation unit is configured to generate the at least one vortex in the superconductor. Preferably, the operating unit, and particularly the magnetic texture generation unit, comprises at least one of the following units: a magnetic field unit for generating a magnetic field in the magnetic material, a magnetic field gradient unit for generating a magnetic field gradient in the magnetic material, an electric field unit for generating an electric field in the magnetic material, a spin torque generation unit for generating spin torques in the magnetic material, a magnon generation unit for generating magnons in the magnetic material, a temperature gradient generation unit for generating a temperature gradient in the magnetic material and a thermal fluctuation generation unit for generating thermal fluctuations in the magnetic material. Further preferably, the operating unit, and particularly the vortex generation unit, comprises a magnetic field unit for applying a magnetic field to the superconductor and a cooling unit for cooling the superconductor below its Curie-temperature. Moreover, the operating unit may comprise a control unit for controlling any of the other units comprised in the operating unit. The controlling may be performed based on predefined or adjustable parameters, wherein the parameters depend on the magnetic material and/or the superconductor of the device.

Moreover, a further aspect of the present invention is the use of the device according to the invention for topological quantum computation and/or quantum memories.

Any quantum circuit can be simulated to an arbitrary degree of accuracy using a combination of CNOT gates and single qubit rotations. Two anyons or Majoranas correspond to one qubit. A "real calculation" can be performed with a minimum of two qubits, i.e. four anyons or Majoranas. With four anyons, the minimal computational basis for all quantum gates needed can be realized. Thus, particularly by providing four anyons or Majoranas, the device according to the present invention can be used for topological quantum computation, the general principles of which are described, e.g., in D. A. Ivanov et al: "Non-Abelian Statistics of Half-Quantum Vortices in p-Wave Superconductors", Phys. Rev. Lett., vol. 86, issue 2, pages 268-271, January 2001, American Physical Society, DOI: 10.1103/PhysRevLett. 86.268, https://journals.aps.org/prl/abstract/10.1103/PhysRevLett. 86.268.

In addition, the method and device according to the invention are intrinsically scalable as the qubit density can simply be increased by adding more magnetic texture-vortex pairs. The basic limitation is merely given by the repulsion length-scale of the pairs, which for currently studied systems is in the order of 10 micrometer. Since one qubit may be represented by four magnetic texture-vortex pairs, this allows for a qubit density of about $10^5$ qubits/$cm^2$. On the long-run disclosing a path to topological quantum computing leads to a considerable reduction of the complexity of quantum error correction, thus saving material and energy resources.

The present invention enables a high computational power, namely a qubit density that is at least a factor of thousand higher than the qubit density of previous suggested systems for a similar computational precision ($10^5$ qubits/$cm^2$ versus 100 qubits/$cm^2$ typically achievable with conventional superconducting qubit systems as here more error correction is needed). Thus, the present invention enables miniaturizing topological quantum computation. In particular, device sizes, that are a factor thousand smaller than previous suggested systems with the same qubit density, are possible. Moreover, with the present invention, topological quantum computation is possible with which problems can be solved, which current classical computers are not able to solve yet. For example, more chemical, pharmaceutical or medical problems can be calculated. Also, neural network systems can be accelerated and a better pattern recognition is possible. Further, improvements in the field of material development and encoding can be achieved.

In a preferred embodiment, the use of the device comprises:
operating the device to provide at least two anyons; and
providing at least one qubit by braiding at least one pair of the at least two anyons.

In a further preferred embodiment, the use of the device further comprises reading out information by fusing at least one of the anyon pairs.

For the above mentioned further independent aspects and in particular for preferred embodiments in this regard, the explanations given above or below concerning the embodiments of the first aspect also hold true. In particular, for one independent aspect of the present invention and for preferred embodiments in this regard, the explanations given above and below concerning the embodiments of the respective other aspects also hold true.

Individual embodiments for solving the problem are described by way of example below with reference to the figures. In this case, the individual embodiments described have in part features which are not absolutely necessary for implementing the claimed subject matter, but which provide desired properties in specific applications. In this regard embodiments which do not have all the features of the embodiments described below are also intended to be regarded as disclosed in a manner coming under the technical teaching described. Furthermore, in order to avoid unnecessary repetitions, specific features are mentioned only with regard to individual embodiments from among the embodiments described below. It is pointed out that the individual embodiments are therefore intended to be considered not only by themselves but also in a joint consideration. On the basis of this joint consideration the person skilled in the art will recognize that individual embodiments can also be modified by inclusion of individual or a plurality of features of other embodiments. It is pointed out that a systematic combination of the individual embodiments with individual or a plurality of features described with regard to other embodiments may be desirable and expedient and is therefore intended to be taken into account and also to be regarded as encompassed by the description.

BRIEF DESCRIPTION OF THE FIGURES

The above and other objects, features and advantages of the present invention will become more apparent upon reading of the following description of preferred embodiments and accompanying drawings. Other features and advantages of the subject-matter described herein will be apparent from the description and the drawings and from the claims. It should be understood that even though embodiments are separately described, single features and functionalities thereof may be combined without prejudice to additional embodiments. The present disclosure is illustrated by way of example and not limited by the accompanying figures.

Preferred embodiments of the present invention are exemplarily described regarding the following figures.

DETAILED DESCRIPTION OF THE FIGURES

The following detailed description relates to exemplary embodiments of the present invention. Other embodiments of the invention are possible within the scope of the invention as defined by the appended claims. For example, in the following description, it is considered that the magnetic texture is a skyrmion, although other magnetic textures such as antiskyrmions or skyrmioniums are possible. Throughout the figures, same reference signs are used for the same or similar elements.

Figure 1:
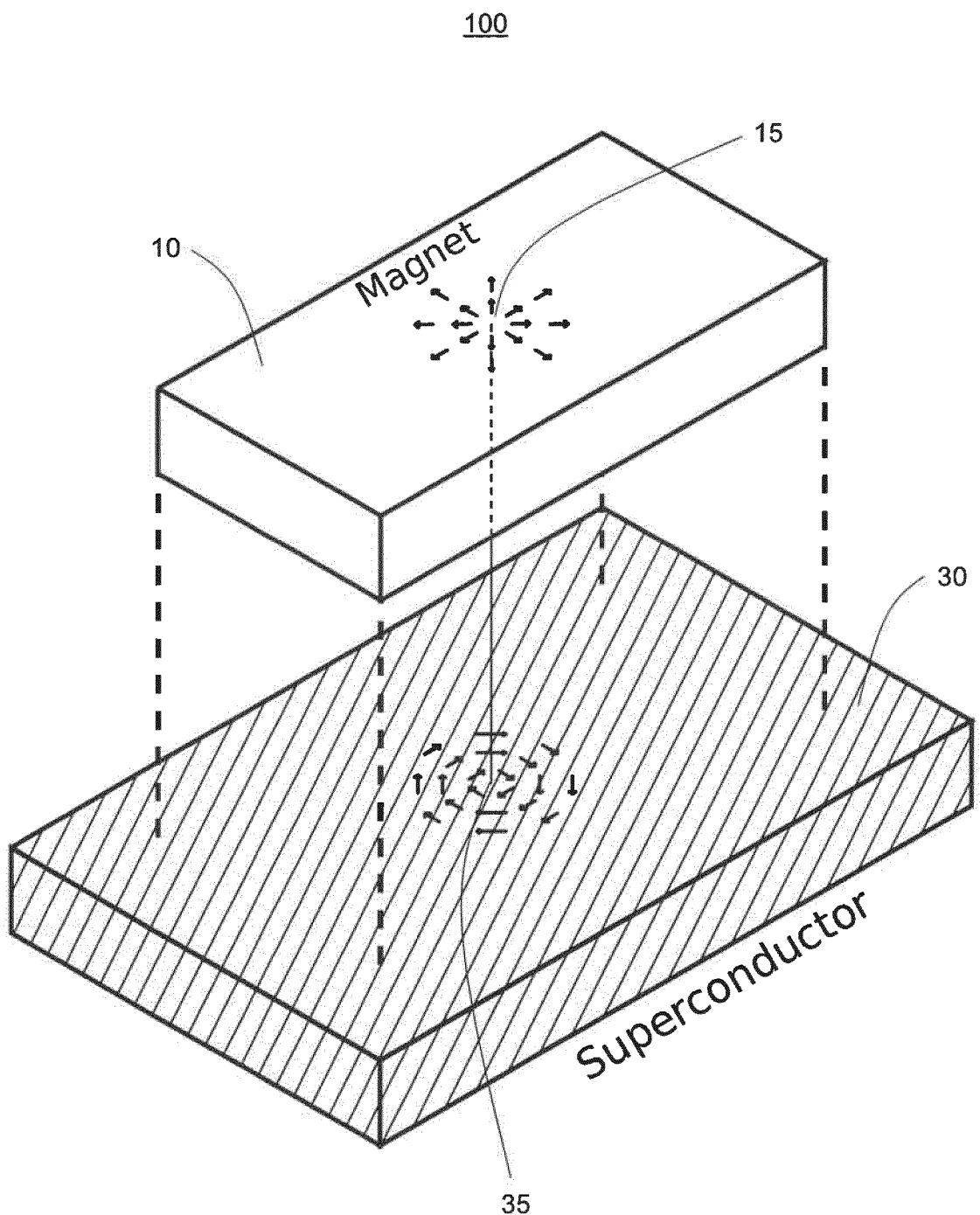
FIG. 1 shows a schematic representation of a device according to an example of the present invention in an exploded view.

FIG. 1 shows a schematic representation of a device 100 according to an example of the present invention in an exploded view. The device 100 comprises a magnetic material 10 and a superconductor 30. The magnetic material 10 contains a skyrmion 15, while the superconductor 30 contains a vortex 35. The magnetic material 10 is arranged on top of the superconductor 30, thereby forming a heterostructure. In the device or heterostructure 100 comprising coupled superconducting and magnetic layer, anyon-carrying superconducting vortices 35 can be controlled via magnetic skyrmions 15. Thereby, it is possible to braid the anyons and to perform topological quantum computation using spintronic techniques.

In particular, the magnetic material 10 which hosts skyrmions 15 is coupled to the type II superconductor 30. Thereby, certain topological quasiparticles, so-called skyrmion-vortex pairs are formed. Within the present invention, it has been found that these skyrmion-vortex pairs bind Majorana modes, which can be used for the braiding. The advantage of skyrmion-vortex pairs is that the localization of the Majorana modes happens completely in the superconductor 30 at the vortices 35 and that the skyrmion 15 even enhances this effect without getting additional Majorana modes at the boundary. Previously, it has been suggested that Majorana modes emerge at the coupling of magnetic (higher order) skyrmion with a superconductor (without coupling them to vortices). However, these Majorana modes have major disadvantages regarding their usability for quantum computation. First of all, in such systems the Majorana modes are only weakly bound to the skyrmion by the exchange field. Furthermore, an additional Majorana mode appears at the boundary of the skyrmion which hinders the braiding.

In the device 100 illustrated in FIG. 1, skyrmion-vortex pairs can be created and annihilated in a controlled manner. For this purpose, the superconductor 30 may be operated to form an Abrikosov vortex lattice and magnetic skyrmions may be written into the magnetic material 10 by standard means. Due to the attractive interaction between skyrmions and vortices, a skyrmion-vortex pair forms. By annihilating the skyrmion in the magnet, also the skyrmion-vortex pair can be annihilated. It is noted that skyrmions can also be written and annihilated by using scanning tunnelling microscopy.

Figure 2A:
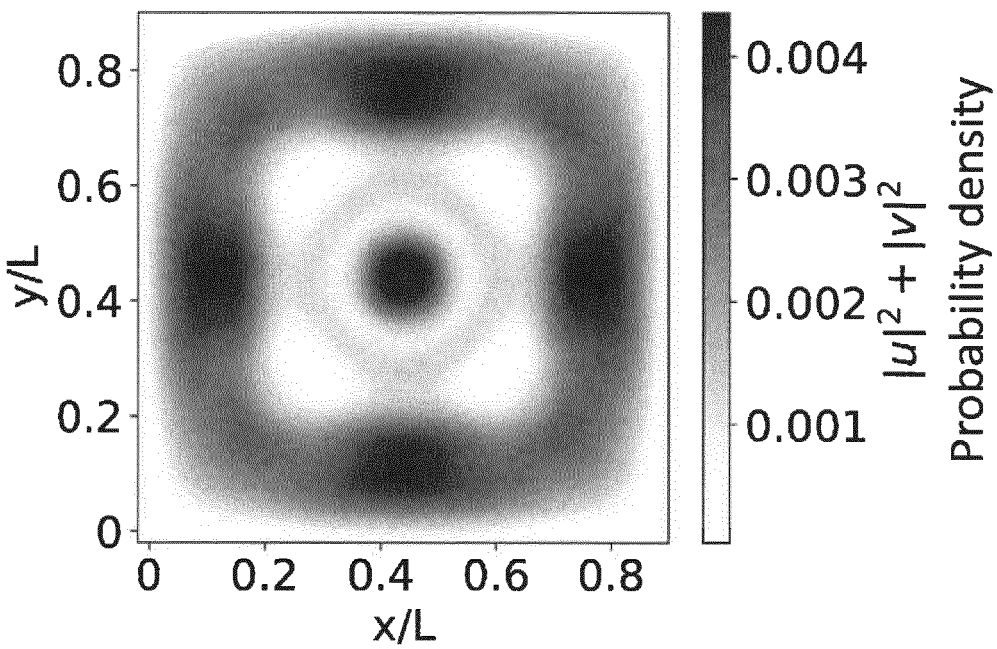
FIG. 2a shows the simulated probability density of Majorana zero modes in a system with one skyrmion-vortex pair.

By solving the Bogoliubov de-Gennes equations self-consistently, it has been found within the present invention that in certain parameter regimes superconductor-ferromagnet heterostructures host Majorana modes, which are one type of anyons. In a system with only one skyrmion-vortex pair, two Majorana zero modes can be found, where one mode is localized within the skyrmion-vortex pair and one is localized on the edge of the sample. This situation is illustrated in FIG. 2a, which shows the simulated probability density of Majorana zero modes in a system with one skyrmion-vortex pair. L represents the dimension (length and width) of the sample. The Majorana mode on the edge is scaled with a factor of three for clarity reasons.

Figure 2B:
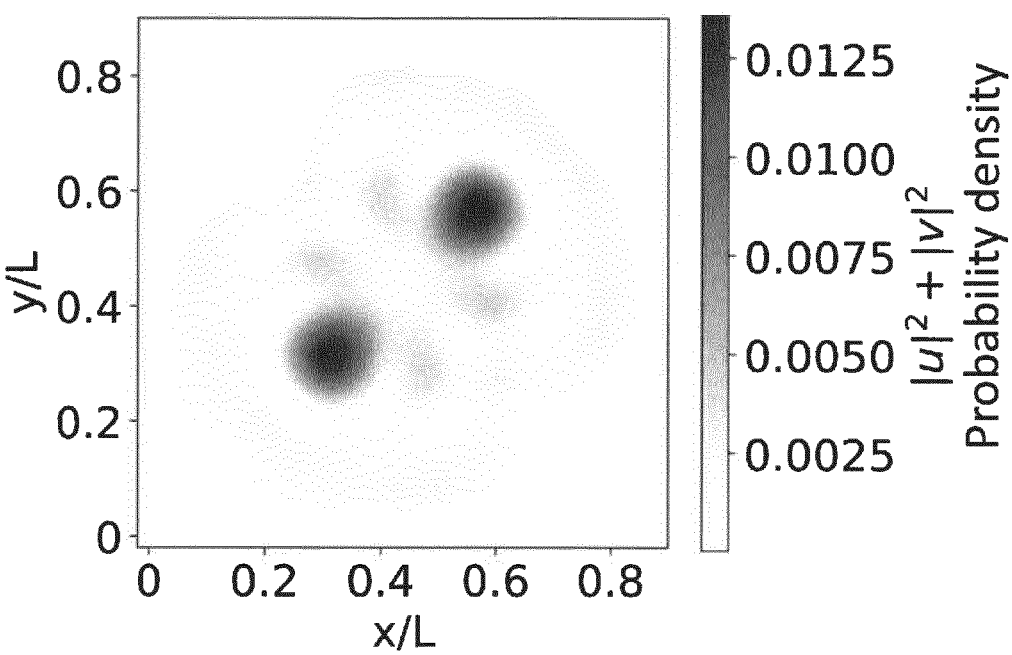
FIG. 2b shows the simulated probability density of Majorana zero modes in a system with two skyrmion-vortex pairs.

When two skyrmion-vortex pairs are present, the two Majorana modes are localized within each of the two pairs, as it is illustrated in FIG. 2b, which shows the simulated probability density of Majorana zero modes in a system with two skyrmion-vortex pairs. Such a setup, where the Majorana modes are only localized to the quasiparticles, allows to individually address the Majorana modes.

The skyrmion-vortex pair is strongly bound: For instance, a theoretical estimate for monolayers of the superconductor $NbSe_2$ indicates that a proximity-induced exchange field in the superconductor on the order of 2.3 meV yields a binding that exceeds the typical temperature scale (3K) of these experimental systems. Therefore, one can use the whole spintronic toolbox to move the skyrmion and thus the skyrmion-vortex pair carrying the anyons.

Figure 3:
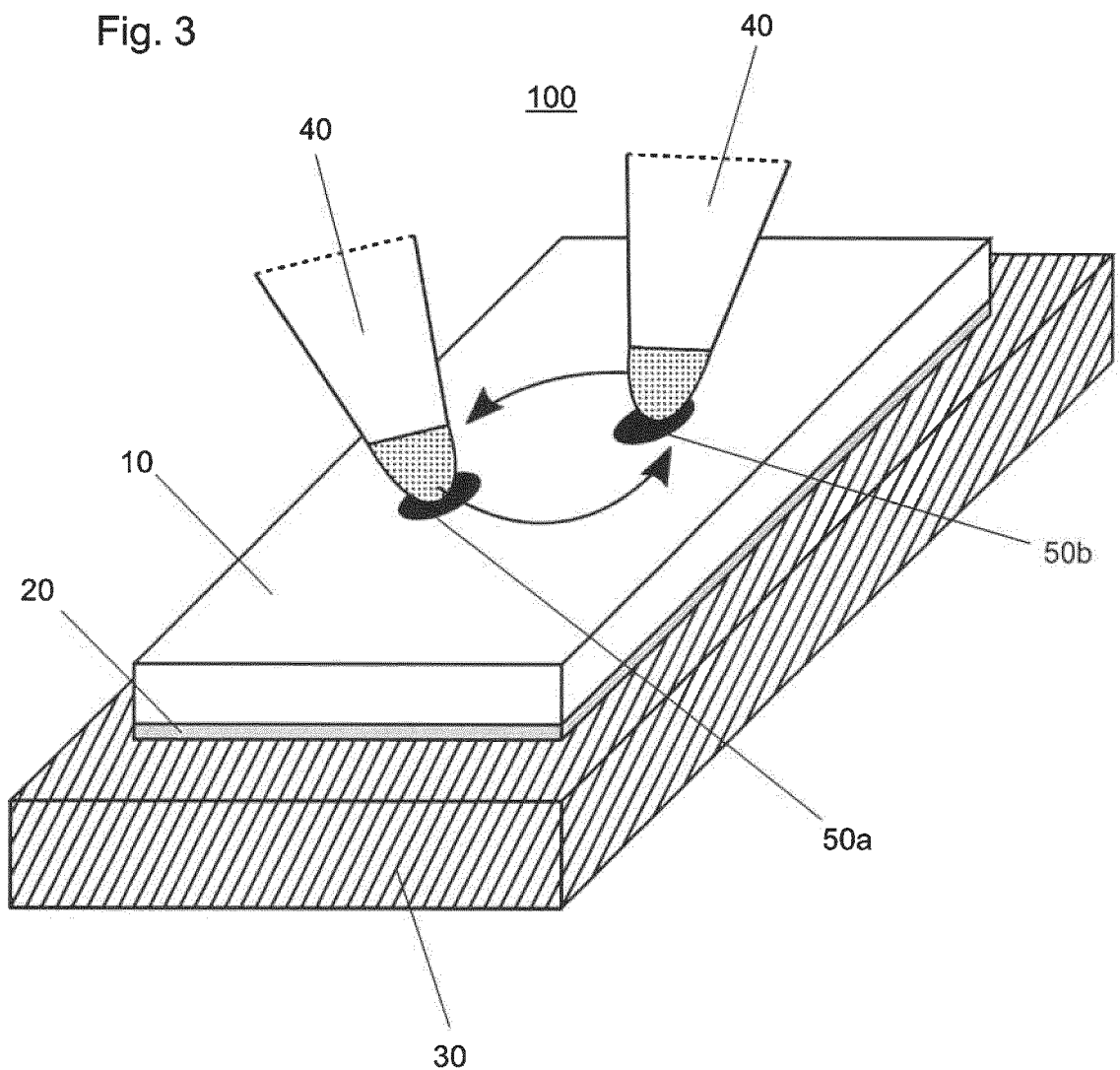
FIG. 3 shows a schematic representation of the device according to another example of the present invention, wherein a magnetic texture-vortex pair is moved with a STM tip.

A controlled version to move magnetic textures is by Scanning Tunnelling Microscopy (STM), as it is illustrated in FIG. 3. FIG. 3 shows a schematic representation of the device 100 according to another example of the present invention. In this example, the magnetic material 10 is separated from the superconductor 30 by an insulator 20. A first and second skyrmion-vortex pair 50a, 50b are moved by a STM tip, respectively. Thereby, the anyons bound to the skyrmion-vortex pairs 50a and 50b can be moved around each other and thus braided. In other words, the skyrmion-vortex pairs 50a and 50b are dragged with a STM tip in order to follow a circular motion until both pairs 50a and 50b are exchanged. This is a good set-up for the proof of principle, however quite unpractical for scalability.

Figure 4A:
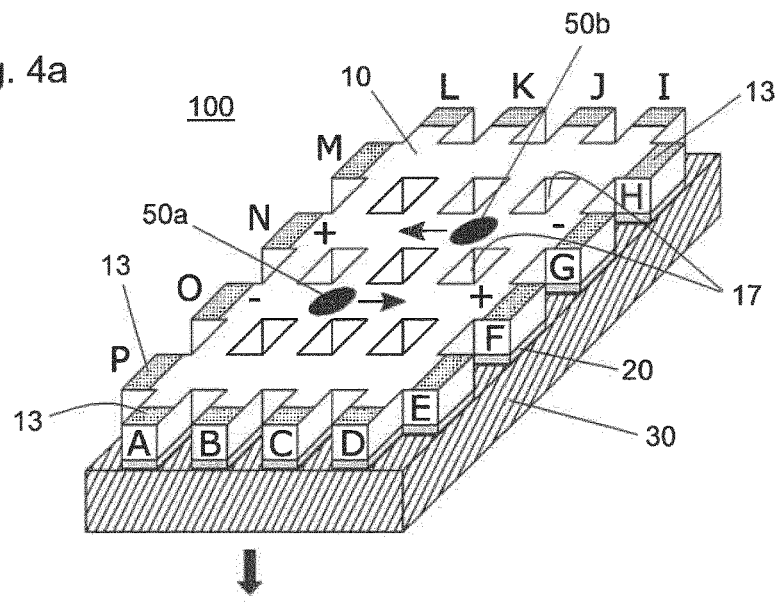
FIGS. 4a-c show schematic representations of the device according to another example of the present invention, wherein two magnetic textures and thus two magnetic texture-vortex pairs are moved with electric currents.
Figure 4B:
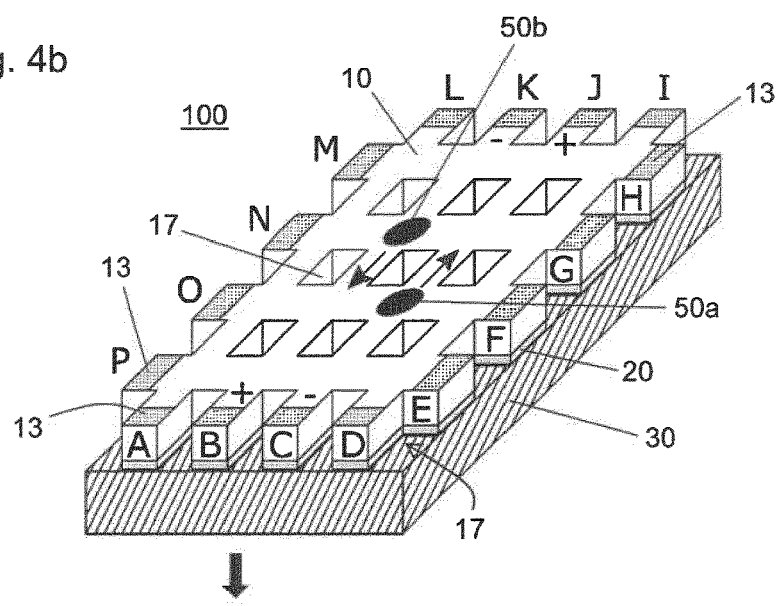
Figure 4C:
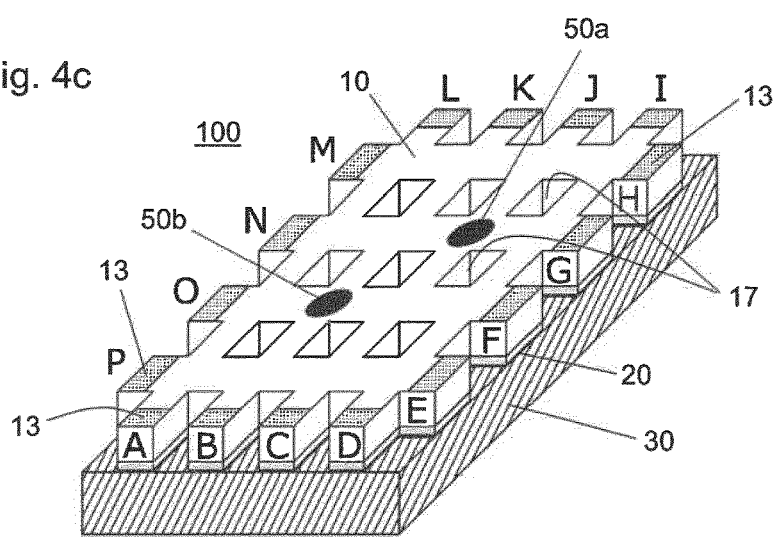

FIGS. 4a-4c show schematic representations of a device 100 according to another example of the present invention, which may be used for scalability. The device 100 of FIGS. 4a-4c again comprises a magnetic material 10 and a superconductor 30. The magnetic material 10 is formed as a grid of magnetic material and arranged on top of the superconductor 30. The grid of magnetic material comprises a plurality of gaps 17, i.e. areas in which no magnetic material is present. The magnetic material 10 is separated by a thin insulating layer 20 from the superconductor, and electric currents are used to move the skyrmions and thus the skyrmion-vortex pairs 50a and 50b. The role of the insulating layer 20 is to protect the superconductor 30 from the current applied to the magnetic material 10. A thickness d of the insulating layer needs to be chosen such that the current flow in the superconductor 30 is negligible while it still experiences a significant exchange field coupling skyrmions and vortices. This is possible as the exchange field and the current scale differently as a function of the insulating layer thickness d. While the exchange field is proportional to $d^2$, the current is proportional to $d^4$. To braid the Majoranas, two skyrmion-vortex pairs 50a, 50b can be moved with counterpropagating currents. This driving needs to be slow enough to ensure that i) a skyrmion-vortex pair 50 does not dynamically unbind, and more important ii) that the superconducting state remains in its (quasi-) zero energy excitation sector. Criterion ii) turns out to be the most stringent one and leads to an estimate of possible skyrmion speeds to be of the order of 40 m/s.

As shown in FIGS. 4a-4c, the grid of the magnetic material 10 has a rectangular geometry and comprises a plurality of electrodes 13 that are labelled with A, B, C . . . to P. According to FIG. 4a, a voltage is applied between electrodes O and F. This induces a current that drives or moves the first skyrmion-vortex pair 50a along a first predefined current path, which is arranged between electrode O and electrode F, towards electrode F. Simultaneously, an opposite voltage is applied between electrodes N and G, thereby inducing a current that drives or moves the second skyrmion-vortex pair 50b along a second predefined current path, which is arranged between electrode G and electrode N, towards electrode N. Subsequently, as illustrated by FIG. 4b, a voltage is applied between electrodes C and J. This induces a current that drives or moves the first skyrmion-vortex pair 50a along a predefined current path, which is arranged between electrode C and electrode J, towards electrode J. Simultaneously, an opposite voltage is applied between electrodes B and K, thereby inducing a current that drives or moves the second skyrmion-vortex pair 50b along a predefined current path, which is arranged between electrode B and electrode K, towards electrode B. Hence, by the procedure illustrated in FIGS. 4a-4c, Majoranas that are bound to skyrmion-vortex pairs 50a and 50b have been braided by exchanging their positions. According to FIGS. 4a-4c, the skyrmion-vortex pairs move from an electrode with negative voltage to an electrode with positive voltage.

Figure 5:
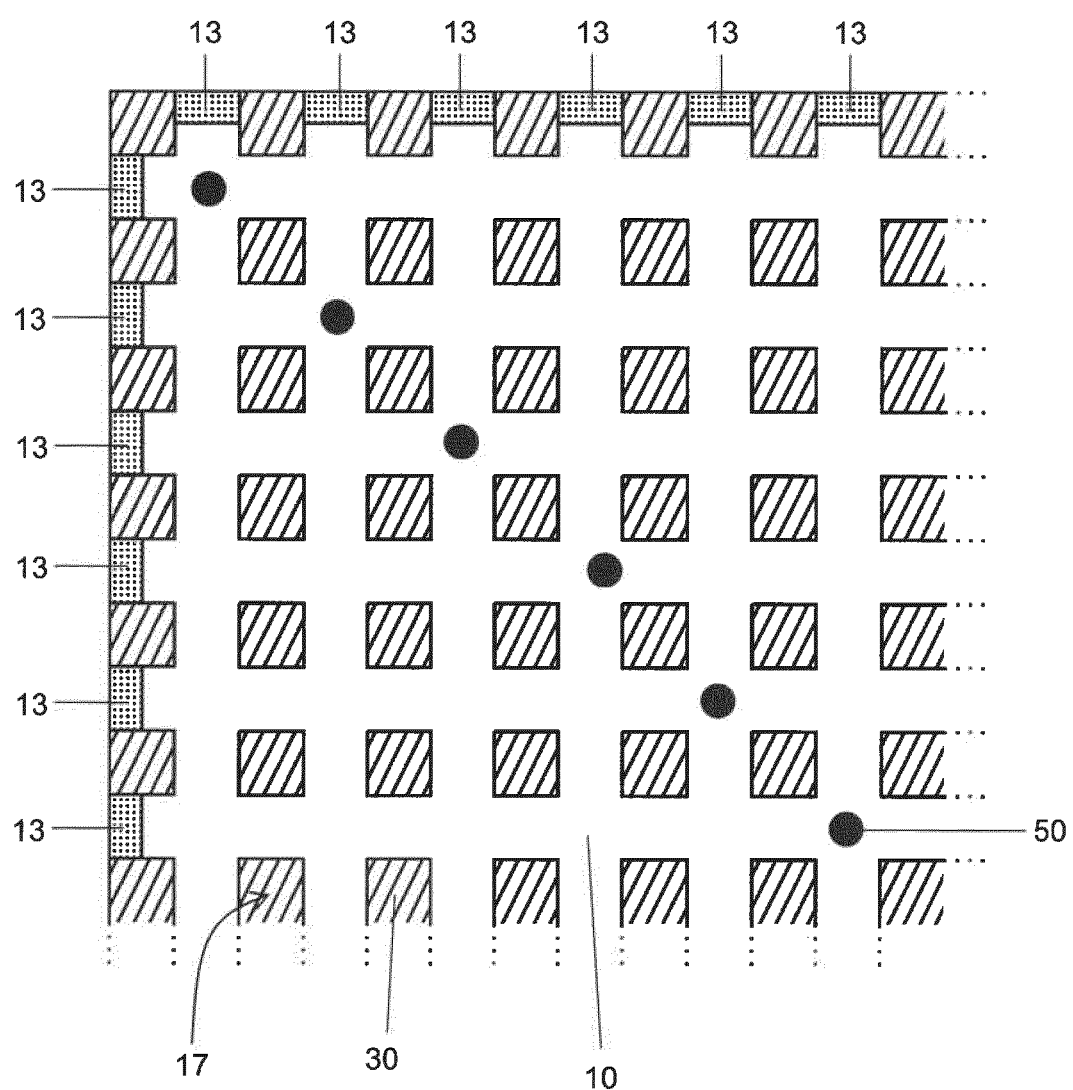
FIG. 5 shows a schematic representation of the device according to another example of the present invention.

FIG. 5 shows a schematic representation of a device 100 according to another example of the present invention in a top view. This example is based on the example shown in FIGS. 4a-4c and illustrates its scalability to provide more qubits. In the example shown, a grid of the magnetic material 10 is arranged on top of the superconductor 30, wherein the grid has quadratic gaps 17.

FIGS. 6a-d show schematic representations of the device 100 according to another example of the present invention, wherein two skyrmions and thus two skyrmion-vortex pairs 50a and 50b are moved by means of electric currents. While the device 100 of FIGS. 4a-4c has a grid of magnetic material with a rectangular geometry, the device 100 of FIGS. 6a-6d has a grid of the magnetic material 10 with a triangular geometry.

Figure 6A:
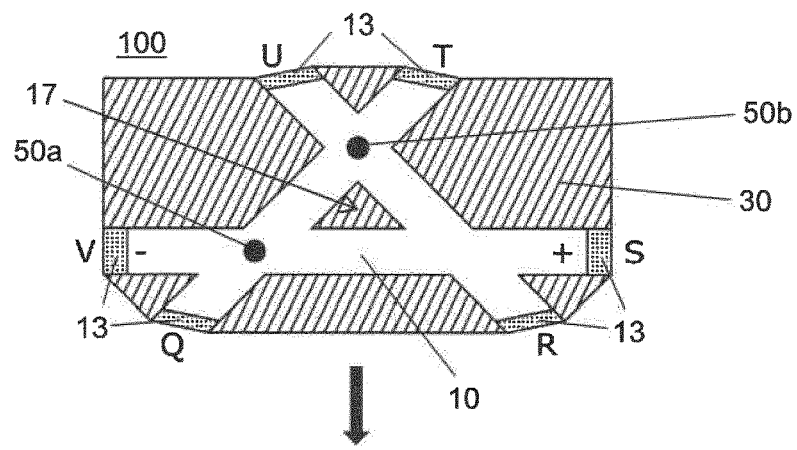
FIGS. 6a-d show schematic representations of the device according to another example of the present invention, wherein two magnetic textures and thus two magnetic texture-vortex pairs are moved with electric currents.
Figure 6B:
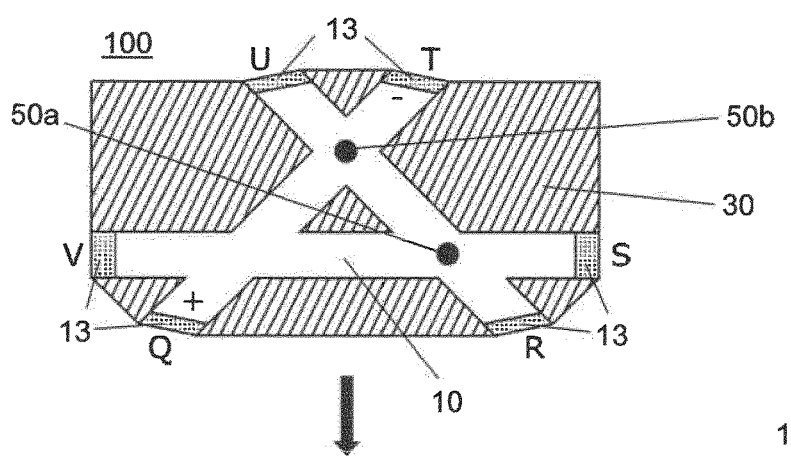
Figure 6C:
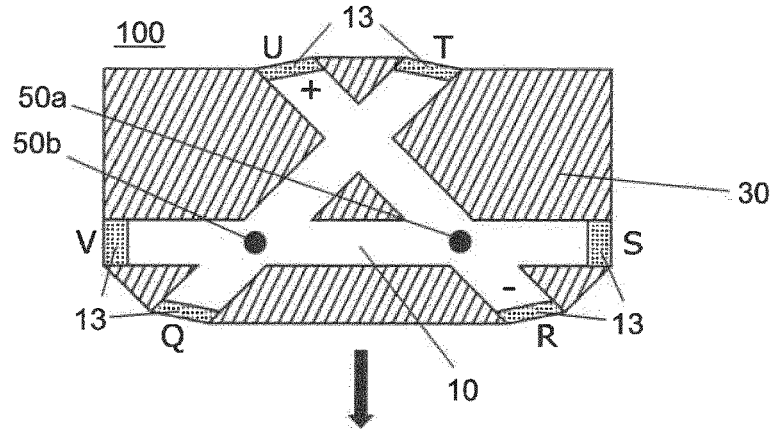
Figure 6D:
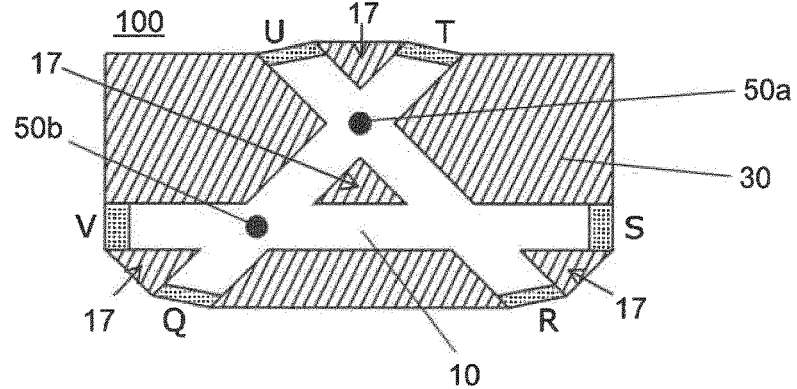

As in FIGS. 4a-4c, the magnetic material 10 is separated by a thin insulating layer (not shown in FIGS. 6a-6d from the superconductor 30, and electric currents are used to move the skyrmions and thus the skyrmion-vortex pairs 50a and 50b. In FIGS. 6a-6d, electrodes 13 are labelled with Q, R, S, T, U and V. To braid the Majoranas, the skyrmion-vortex pairs 50a, 50b are moved as follows: According to FIG. 6a, a voltage is applied between electrodes V and S. This induces a current that drives or moves the first skyrmion-vortex pair 50a along a predefined current path, which is arranged between electrode V and electrode S, towards electrode S. Subsequently, as illustrated by FIG. 6b, a voltage is applied between electrodes T and Q. This induces a current that drives or moves the second skyrmion-vortex pair 50b along a predefined current path, which is arranged between electrode T and electrode Q, towards electrode Q. Subsequently, as illustrated by FIG. 6c, a voltage is applied between electrodes R and U. This induces a current that drives or moves the first skyrmion-vortex pair 50a along a predefined current path, which is arranged between electrode R and electrode U, towards electrode U. Hence, by the procedure illustrated in FIGS. 6a-6d, Majoranas that are bound to skyrmion-vortex pairs 50a and 50b have been braided by exchanging their positions. According to FIGS. 6a-6c, the skyrmion-vortex pairs move from an electrode with negative voltage to an electrode with positive voltage.

Figure 7:
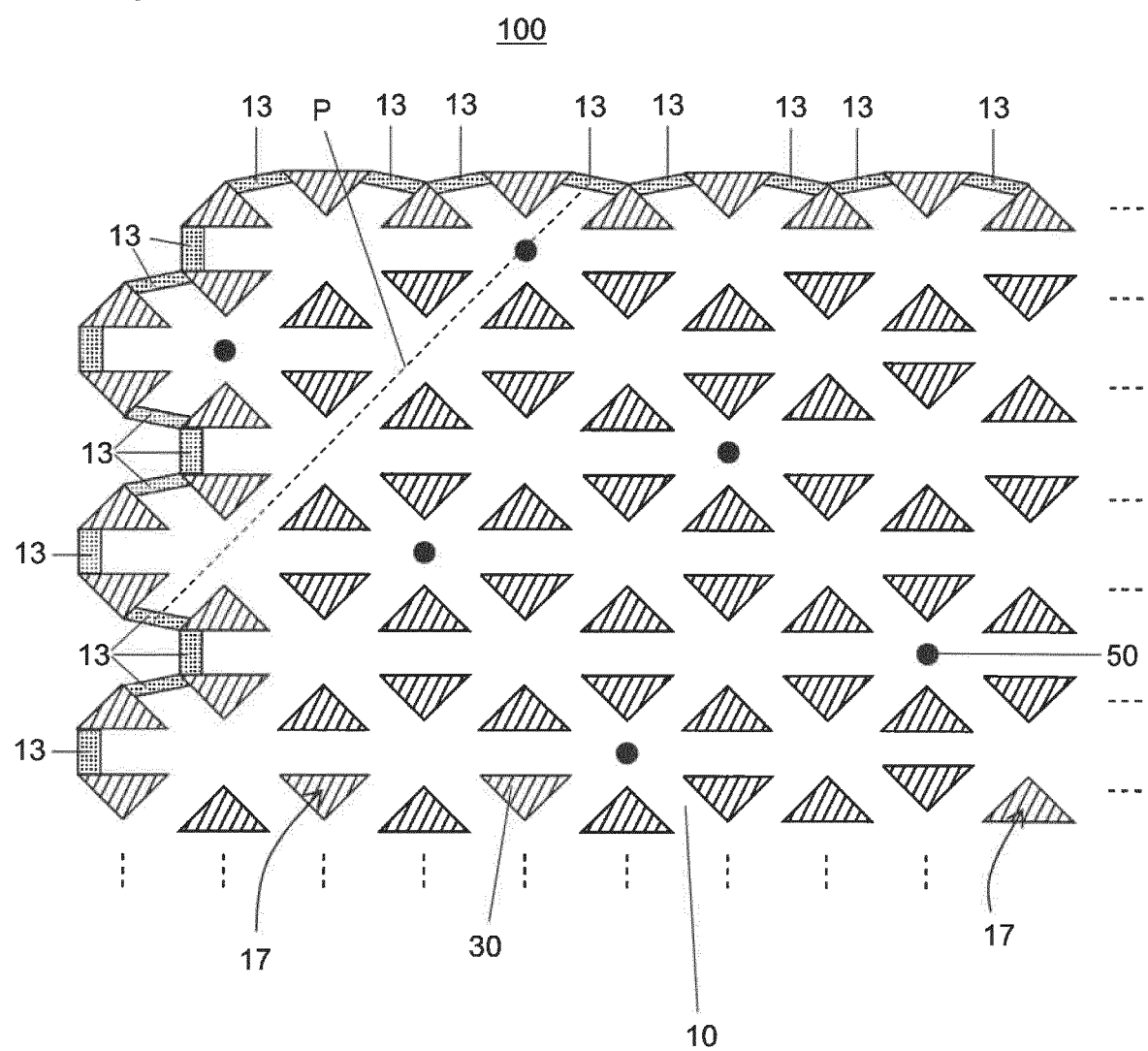
FIG. 7 shows a schematic representation of the device according to another example of the present invention.

FIG. 7 shows a schematic representation of a device 100 according to another example of the present invention in a top view. This example is based on the example shown in FIGS. 6a-6d and illustrates its scalability to provide more qubits. In the example shown, a grid of the magnetic material 10 is arranged on top of the superconductor 30, wherein the grid has triangular gaps. The dashed line in FIG. 7 indicates one of the predefined current paths P. The path has two end portions, wherein each of the end portions comprises an electrode 13.

Being able to braid anyons, which is the heart of any topological quantum gate, opens the path towards a fully-fledged topological quantum computer. To verify the functionality of any gate, the system has to be read out. This can be done by fusing two anyons. A possible scheme to accomplish the fusing of anyons bound to the skyrmion-vortex pairs, is to pin one of the skyrmions and move the other one into it. By fusing the anyons, access is given to the logical information stored in the state of the system.

In summary, with the present invention, an experimental realisable platform is provided to create, manipulate and read-out anyons, in particular those of the simplest non-Abelian class, i.e., Majorana zero-energy modes, in a more practical way than any other theoretical suggestions made before. In particular, direct means to perform a smoking gun experiment for braiding is provided, which up to date has not been observed and which is a key missing component in the field of topological quantum computation. The present invention does not only allow for creating, braiding and fusing anyons, but also provides the possibility to scale up the number of qubits, thus paving the way and solving several challenges for topological quantum computation. More specifically, the present invention empowers the braiding of anyonic quasi-particles with the help of presently available technology, thus proving and providing a central building block for the realization of a topological quantum computer.

LIST OF REFERENCE NUMERALS

10 magnetic material (magnetic layer)
13 electrode
15 magnetic texture (skyrmion)
17 gap in the magnetic material
20 insulator (insulating layer)
30 superconductor (superconducting layer)
35 superconducting vortex
40 scanning tunnelling microscope (STM) tip
50 magnetic texture-vortex pair (skyrmion-vortex pair)
50a first magnetic texture-vortex pair (first skyrmion-vortex pair)
50b second magnetic texture-vortex pair (second skyrmion-vortex pair)
100 device (magnet-superconductor heterostructure)
P path

The invention claimed is:

1. A method for providing at least one anyon that is usable for topological quantum computation, the method comprising:
   providing a magnetic material containing at least one magnetic texture, wherein the magnetic material is structured to form a grid of magnetic material, wherein the grid of magnetic material forms a plurality of paths in which the at least one magnetic texture is movable;
   providing a superconductor containing at least one vortex; and
   creating at least one magnetic texture-vortex pair by coupling the magnetic material to the superconductor, wherein each magnetic texture-vortex pair binds an anyon being localized at the vortex of the respective magnetic texture-vortex pair in the superconductor.

2. The method of claim 1, wherein the at least one magnetic texture includes a skyrmion.

3. The method of claim 1, wherein the at least one magnetic texture-vortex pair includes a skyrmion-vortex pair.

4. The method of claim 1, wherein the anyon is a Majorana zero mode.

5. The method of claim 1, wherein coupling the magnetic material to the superconductor includes arranging the magnetic material and the superconductor such that a heterostructure based on the magnetic material and the superconductor is formed.

6. The method of claim 1, further comprising:
   moving at least two magnetic texture-vortex pairs by means of spintronic techniques such that the anyons that are bound to the moved magnetic texture-vortex pairs are braided,
   wherein the spintronic techniques include applying magnetic field gradients to the magnetic material, applying electric fields to the magnetic material, inducing spin torques in the magnetic material, inducing magnons in the magnetic material, generating temperature gradients within the magnetic material, and/or generating thermal fluctuations within the magnetic material.

7. The method of claim 1, wherein two magnetic texture-vortex pairs are braided by moving the two magnetic texture-vortex pairs by means of at least one scanning-tunnelling microscope tip and/or by applying currents in the magnetic material.

8. The method of claim 1, further comprising reading out information by fusing two anyons.

9. The method of claim 1, wherein providing the magnetic material includes structuring the magnetic material to form a grid of magnetic material, and
   wherein the grid of magnetic material comprises a plurality of electrodes and/or wherein the grid of magnetic material comprises gaps having a rectangular or a triangular cross section.

10. The method according to claim 1, further comprising:
    creating at least two magnetic texture-vortex pairs by coupling the magnetic material to the superconductor, wherein a first magnetic texture-vortex pair binds a first anyon being localized at the vortex of the respective magnetic texture-vortex pair in the superconductor and a second magnetic texture-vortex pair binds a second anyon being localized at the vortex of the respective magnetic texture-vortex pair in the superconductor; and
    providing a qubit by braiding the first and second anyons.

11. The method according to claim 10, further comprising:
    reading out information by fusing the first and second anyons.

12. A device for providing at least one anyon, the device comprising:
    a magnetic material which, in an operational mode of the device, contains at least one magnetic texture, wherein the magnetic material is structured to form a grid of magnetic material, wherein the grid of magnetic material forms a plurality of paths in which the at least one magnetic texture is movable; and
    a superconductor which, in the operational mode of the device, contains at least one vortex,
    wherein the magnetic material and the superconductor are arranged to be coupled to each other such that at least a magnetic texture-vortex pair is created in the operational mode of the device,
    wherein each magnetic texture-vortex pair binds an anyon being localized at the vortex of the respective magnetic texture-vortex pair in the superconductor.

13. The device of claim 12, wherein the magnetic material and the superconductor form a heterostructure, and/or wherein an insulating layer is arranged between the magnetic material and the superconductor.

14. The device of claim 12, wherein the magnetic material is structured to form a grid of magnetic material, wherein the grid has a rectangular or a triangular geometry.

15. The device of claim 12, wherein the magnetic material is structured to form a grid of magnetic material, wherein the grid comprises gaps having a rectangular or a triangular cross section.

16. The device of claim 12, wherein the magnetic material is structured to form a grid of magnetic material, wherein the grid comprises a plurality of electrodes to which a voltage is applicable.

17. The device of claim 12, wherein each of the paths has two end portions and wherein each of the end portions comprises an electrode.

18. The device of claim 12, further comprising an operating unit which is configured to operate the magnetic material and the superconductor in the operational mode.

19. A device for quantum computation, the device comprising:
    a magnetic material which, in an operational mode of the device, contains at least one magnetic texture; and
    a superconductor which, in the operational mode of the device, contains at least one vortex,
    wherein the magnetic material and the superconductor are arranged to be coupled to each other such that at least four magnetic texture-vortex pairs are created in the device,
    wherein each of the at least four magnetic texture-vortex pairs binds a respective anyon being localized at the vortex of the respective magnetic texture-vortex pair in the superconductor; and
    means for braiding a first anyon and a second anyon to provide a first qubit and for braiding a third anyon and a fourth anyon to provide second qubit,
    wherein the first qubit and second qubit are configured to form a quantum circuit for quantum computation.

20. The device of claim 19, wherein braiding the first anyon and second anyon and braiding the third anyon and the fourth anyon includes moving at least two of the magnetic texture-vortex pairs with counterpropagating currents.

* * * * *